United States Patent
Van Beek et al.

(10) Patent No.: US 8,058,952 B2
(45) Date of Patent: Nov. 15, 2011

(54) MEMS RESONATOR, A METHOD OF MANUFACTURING THEREOF, AND A MEMS OSCILLATOR

(75) Inventors: Jozef T. M. Van Beek, Rosmalen (NL); Bart Van Velzen, Arnhem (NL)

(73) Assignee: NXP B.V., Eindhoven (NL)

( * ) Notice: Subject to any disclaimer, the term of this patent is extended or adjusted under 35 U.S.C. 154(b) by 352 days.

(21) Appl. No.: 12/158,986

(22) PCT Filed: Dec. 18, 2006

(86) PCT No.: PCT/IB2006/054930
§ 371 (c)(1),
(2), (4) Date: Sep. 19, 2008

(87) PCT Pub. No.: WO2007/072408
PCT Pub. Date: Jun. 28, 2007

(65) Prior Publication Data
US 2009/0121808 A1 May 14, 2009

(30) Foreign Application Priority Data
Dec. 23, 2005 (EP) .................................... 05112943

(51) Int. Cl.
*H03H 9/24* (2006.01)
*H03H 9/125* (2006.01)
*H03H 3/007* (2006.01)
*H03B 5/30* (2006.01)
(52) U.S. Cl. .......... 333/186; 438/50; 438/386; 438/426; 331/116 M; 331/154; 310/309
(58) Field of Classification Search .................. 333/186, 333/197, 199, 200; 438/50, 379, 386, 404, 438/424–426, 435–437, 439, 444; 310/309; 331/116 R, 116 M, 154
See application file for complete search history.

(56) References Cited

U.S. PATENT DOCUMENTS

| | | | |
|---|---|---|---|
| 5,198,390 A | | 3/1993 | MacDonald et al. |
| 5,349,855 A | | 9/1994 | Bernstein et al. |
| 6,621,134 B1 | * | 9/2003 | Zurn ............................. 257/415 |
| 7,023,065 B2 | * | 4/2006 | Ayazi et al. ................... 257/414 |
| 7,161,438 B2 | * | 1/2007 | Wood .............................. 331/57 |
| 7,522,019 B2 | * | 4/2009 | Bhave et al. .................. 333/187 |
| 7,551,043 B2 | * | 6/2009 | Nguyen et al. ................ 333/186 |
| 2004/0080382 A1 | | 4/2004 | Nakanishi et al. |
| 2005/0124135 A1 | | 6/2005 | Ayazi et al. |
| 2006/0017523 A1 | | 1/2006 | Bave et al. |
| 2007/0072327 A1 | * | 3/2007 | Weigold .......................... 438/50 |

FOREIGN PATENT DOCUMENTS
WO 2004027796 A2 4/2004

OTHER PUBLICATIONS

Yu-Wei, Lin; et al "Vibrating Micromechanical Resonators With Solid Dielectric Capacitive Transducer Gaps" Frequency Control Symposium and Exposition, 2005. Proceedings. Aug. 29, 2005, pp. 128-134.

* cited by examiner

*Primary Examiner* — Barbara Summons

(57) ABSTRACT

The invention relates to a MEMS resonator comprising a first electrode, a movable element (48) comprising a second electrode, the movable element (48) at least being movable towards the first electrode, the first electrode and the movable element (48) being separated by a gap (46, 47) having sidewalls. According to the invention, the MEMS resonator is characterized in that the gap (46, 47) has been provided with a dielectric layer (60) on at least one of the sidewalls.

20 Claims, 2 Drawing Sheets

MEMS RESONATOR, A METHOD OF MANUFACTURING THEREOF, AND A MEMS OSCILLATOR

The invention relates to a MEMS resonator comprising a first electrode, a movable element comprising a second electrode, the movable element at least being movable towards the first electrode, the first electrode and the movable element being separated by a gap having sidewalls.

The invention also relates to a method of manufacturing such a MEMS resonator.

The invention further relates to a MEMS oscillator comprising a MEMS resonator, and to an integrated circuit comprising such a MEMS oscillator.

A MEMS resonator is known from WO 2004/027796A2. This document discloses an in-plane clamped-clamped beam resonator. The clamped-clamped beam resonator includes a single crystal silicon (SCS) beam disposed between two clamped regions. The SCS beam has a defined width and height, and functions as the resonating element for the clamped-clamped beam resonator 200. A drive electrode and a sense electrode oppose one another, and are separated from the SCS beam by submicron gaps. The electrodes preferably comprise polysilicon. Thus, the clamped-clamped beam resonator is primarily, or entirely, comprised of silicon.

A drawback of the known MEMS resonator is that it is difficult to manufacture.

It is an object of the invention to provide an alternative MEMS resonator of the kind set forth in the opening paragraph, which is relatively easy to manufacture. The invention is defined by the independent claims. The dependent claims define advantageous embodiments.

According to the invention, this object is achieved in that the gap has been provided with a dielectric layer on at least one of the sidewalls. Silicon MEMS resonators are excited and sensed using capacitive transduction. The efficiency of this transduction strongly depends on de distance (gap width) between the resonator and its excitation and/or sense electrodes. Typically, distances well below 1 μm are required in most applications, such as in oscillators and accelerometers. These narrow gaps cannot be manufactured using conventional lithographic techniques. For the device in WO 2004/027796A2 many processing steps are required, including the use of sacrificial layers and additional etching steps. The invention, however, enables the reduction of the gap width in a simple way, namely by using only one additional process step.

The invention further relies upon the insight that the dielectric material provided on the sidewall has a dielectric constant larger than 1 and that this fact can be exploited. It has been the inventor's insight that due to the dielectric constant being larger than 1, the effective gap width is smaller than the distance between the electrodes. The term "effective gap width" is further explained in the description of the drawings of this specification.

In an advantageous embodiment of the MEMS resonator according to the invention, the dielectric layer has been provided on at least two of the sidewalls. The advantage of this measure is that both the physical gap width and the effective gap width are reduced even further.

In another embodiment of the MEMS resonator according to the invention, the MEMS resonator further comprises a further electrode, the movable element being movable towards the further electrode, the further electrode and the movable element being separated by a further gap having further sidewalls, said further gap having been provided with a further dielectric layer on at least one of the further sidewalls. The additional electrode enables a designer to implement, for example, the first electrode as an excitation electrode (e.g. for capacitively exciting the movable element) and the second electrode as a sensing electrode (e.g. for measuring the capacitance modulation due to a varying width of the further gap).

Advantageously, the further dielectric layer has been provided on at least two of the further sidewalls.

Preferably, the dielectric or the further dielectric comprises at least one of the following materials: silicon dioxide, silicon nitride, or ferroelectric materials such as PZT or PLZT. The larger the dielectric constant of the dielectric the more the effective gap width is reduced.

The invention also relates to a method of manufacturing a MEMS resonator. The method according to the invention comprises the following steps:

providing a semiconductor body comprising a substrate layer, a sacrificial layer provided on the substrate layer, and a top layer provided on the sacrificial layer;

patterning the top layer for forming a gap, the gap locally exposing the sacrificial layer, the gap being further arranged for defining a movable element;

selectively removing the sacrificial layer for partially releasing the movable element from the substrate layer; and providing a dielectric layer on at least one sidewall of the gap associated with the top layer around the movable element.

WO 2004/027796A2 discloses a method of forming gaps having widths smaller than obtainable with lithographic techniques. In this method, an additional sacrificial oxide layer is deposited in gaps next to a resonator, whereafter it is immediately partially removed so that a thin nanometer-range oxide layer remains on the resonator. The remaining gap is then filled with polysilicon for forming electrodes. Releasing of the resonator structure is done as a last step of the method where both the thin sacrificial oxide layer and the oxide layer are selectively etched away. Thus, this document discloses quite a complicated method of forming gaps having widths smaller than obtainable with lithographic techniques.

The method according to the invention is quite different from the above-mentioned method. In the method according to the invention, the movable element is released before the dielectric layer is provided on at least one sidewall. Moreover, this dielectric is not removed, which follows from the earlier described insight of the inventor. Fewer process steps are thus required in the method according to the invention.

US 2005/0124135 A1 discloses three alternative methods of forming gaps having widths smaller than obtainable with lithographic techniques. In the first method, disclosed in US 2005/0124135 A1, a layer of oxide is thermally grown or deposited on a silicon substrate and patterned to form trenches therein. Thereafter, a thin layer of polysilicon is deposited on top of the layer of oxide. Subsequently, the trenches are refilled with oxide and etched back so that the sacrificial oxide layer on the sidewalls of the trenches is exposed. Finally, the sacrificial sidewall polysilicon is etched, thereby producing nano-trenches.

In the second method, disclosed in US 2005/0124135 A1, a layer of nitride is formed on a substrate. A polysilicon layer is then deposited and patterned using a mask having openings. The patterned polysilicon layer is then oxidized to form a relatively thick oxide mask, wherein the openings are reduced in size to submicron dimensions. This mask may then be used to form submicron trenches by means of etching.

In the third method, disclosed in US 2005/0124135 A1, an SOI wafer comprising a first silicon layer, an oxide layer and a second oxide layer is provided. Then, a thin layer of nitride is deposited on the SOI wafer, which prevents oxidation of the second silicon layer in subsequent process steps. A thin-film polysilicon layer is deposited and patterned to produce openings. The patterned polysilicon layer is oxidized to form an oxide mask. During oxidation the openings are reduced in size. Then anisotropic dry etching of the thin nitride layer is performed, followed by an ion etching step to etch the second polysilicon layer down to the oxide layer. Finally, the oxide layer is locally removed so as to partially release part of the resulting microstructure.

All three methods have in common that a mask having reduced dimensions is used to etch trenches having submicron dimensions. This is fundamentally different from the method according to the invention, which does not comprise a step of etching a trench having a submicron width. On the contrary, the trench to be formed may have ordinary dimensions obtainable by conventional lithographic techniques. In the method according to the invention, the dimension of the trench is reduced after the trench has been formed, which greatly simplifies the manufacturing process.

Please note that the order of the steps in the method according to the invention can be changed. For example, the second material can be provided to the movable element before selectively removing the sacrificial layer. Conventional steps like etching, deposition, CMP may be used for this purpose.

An advantageous embodiment of the method according to the invention is characterized in that in the step of providing a semiconductor body a top layer is provided on the sacrificial layer, which comprises silicon. The use of silicon has the advantage that it is compatible with most process technologies and thus enables easy integration with integrated circuits.

A further improvement of the previous embodiment is characterized in that the step of providing a dielectric layer comprises an oxidation step, whereby at least the silicon of at least one sidewall of the gap associated with the top layer is converted into silicon oxide. Oxidation of silicon is a technique which is well controllable and also available in most MEMS manufacturing environments. Silicon dioxide is a dielectric material having a dielectric constant of 3.9, which is beneficial for reducing the effective gap width significantly.

An alternative embodiment is characterized in that the step of providing a dielectric layer comprises deposition of the dielectric layer, the dielectric layer being provided on at least one sidewall of the gap associated with the top layer. Deposition techniques also offer a high controllability of the deposited dielectric layer.

Preferably, the step of deposition of the dielectric layer comprises the deposition of at least one of the following materials: silicon dioxide and silicon nitride.

Also, the step of deposition of the dielectric layer is preferably performed using one of the following techniques: atomic layer deposition (ALD) and low-pressure chemical vapor deposition (LPCVD).

The invention further relates to a MEMS oscillator comprising a MEMS resonator. The smaller gap helps reduce the motional impedance of the MEMS resonator. A low motional impedance (e.g. <10 kOhm) at resonance is required in order to get a low oscillator phase noise.

The invention further relates to an integrating circuit comprising such a MEMS oscillator. The formation of a silicon oxide layer over a silicon resonator is compatible with the process flow of integrated circuits. The MEMS resonator according to the invention therefore allows relatively straightforward integration of a monolithic integrated MEMS oscillator.

Any of the additional features can be combined together and combined with any of the aspects. Other advantages will be apparent to those skilled in the art. Numerous variations and modifications are possible without departing from the claims of the present invention. Therefore, it should be clearly understood that the present description is illustrative only and is not intended to limit the scope of the present invention.

How the present invention may be put into effect will now be described by way of example with reference to the appended drawings, in which.

Figure 1A:
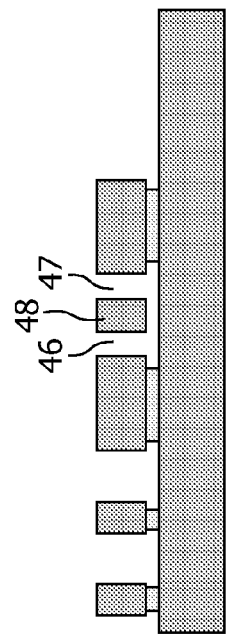
FIG. 1a to FIG. 1e illustrate a method of manufacturing a MEMS resonator according to one embodiment of the method according to the invention.

The present invention will be described with respect to particular embodiments and with reference to certain drawings but the invention is not limited thereto, as its scope is limited only by the appended claims. Any reference signs in the claims shall not be construed as limiting the scope. The drawings described are only schematic and are non-limiting. In the drawings, the size of some of the elements may be exaggerated and not drawn to scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless specifically stated otherwise.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

FIG. 1a to FIG. 1e illustrate a MEMS resonator in various stages of its manufacturing process according to one embodiment of the method according to the invention.

FIG. 1a refers to one stage of the manufacturing process, in which a semiconductor body 10 is provided. The semiconductor body 10 comprises a substrate layer 20, a sacrificial layer 30 provided on the substrate layer 20, and a top layer 40 provided on the sacrificial layer 30. The top layer 40 may comprise silicon in one embodiment of the invention, but other materials are also possible, like, for instance, germanium (Ge), III-V semiconductor compounds like gallium-arsenide (GaAs), II-VI semiconductor compounds like indium-phosphide (InP), and other materials. For the sacrificial layer 30 materials like silicon dioxide ($SiO_2$) may be used, but other materials are also possible. In case silicon is used as the material for the top layer 40 and silicon oxide (or another insulating material) as the material for the sacrificial layer 30, also the term silicon-on-insulator (SOI) is used. Silicon-on-insulator substrates/wafers are widely available in the market and can be manufactured in a cheap and easy way. In the example illustrated in FIG. 1a to FIG. 1e, a SOI substrate 10 is used, in which the top layer 40 comprises silicon, and in which the insulating (sacrificial) layer 30 comprises silicon dioxide.

Figure 1B:
Figure 1C:
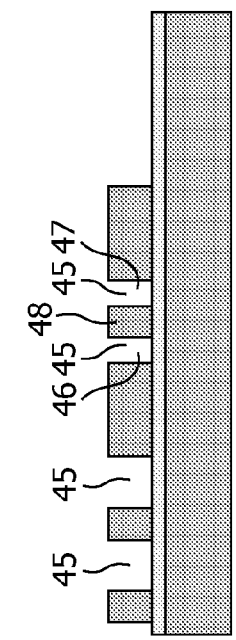

FIG. 1b and FIG. 1c illustrate other stages of the manufacturing process. In FIG. 1b, a patterned mask layer 50 is provided having openings 55 therein. The patterning of the mask layer 50 may be done by using, for example, conventional optical lithographic techniques, but also other lithographic techniques may be used, like electron-beam lithography, ion-beam lithography and x-ray lithography. In these techniques, patterns are written directly onto the mask layer 50. In this particular example, photolithography is used. The mask layer 50 may then comprise a photoresist layer, but could also be a hard mask, e.g. made of silicon oxide or silicon nitride. In FIG. 1c, the top layer 40 is patterned through the openings 55 in the mask layer 50. As a result, openings 45 are formed in the top layer 40, which correspond with the openings 55 in the mask layer. This can be done by using, for example, a dry etching step (e.g. DRIE etching). Etching techniques are known by the person skilled in the art. The openings 45 are formed such that they expose sacrificial layer 30 underneath the top layer 40. Also gaps 46,47 are formed, which define a movable element 48 of the MEMS resonator to be manufactured.

Figure 1D:
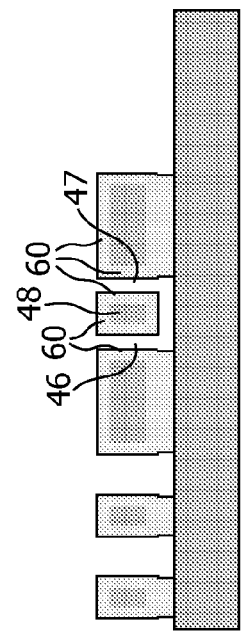

In FIG. 1d, showing another stage of the manufacturing process, the sacrificial layer 30 is locally removed (at least under the movable element) for partially releasing the movable element 48. This may be done by using, for example, a selective wet etching step. Selective etching techniques are also known by the person skilled in the art. The movable element is disposed between clamped regions (not shown in the Figure). In this particular example, the movable element 48 is (at least) movable in a direction perpendicular to the sidewalls of the gaps 46,47.

Figure 1E:
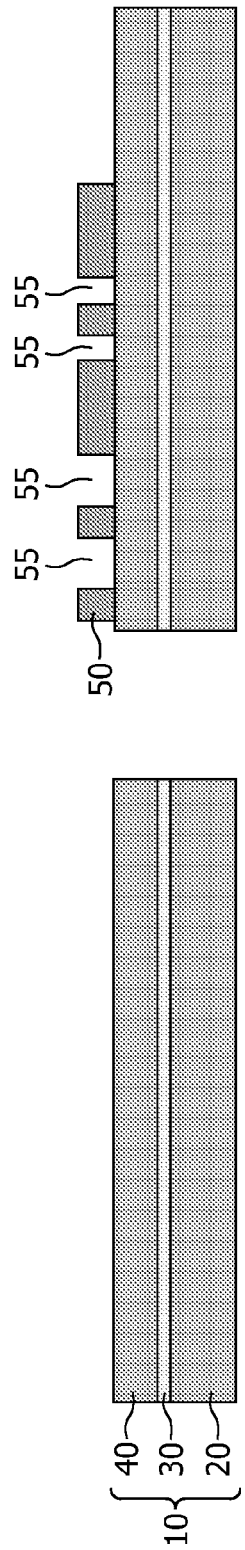

Silicon MEMS resonators are excited and sensed using capacitive transduction. The efficiency of this transduction strongly depends on de distance (gap width) between the resonator and its excitation and/or sense electrodes. Typically, distances well below 1 μm are required in most applications, such as in oscillators and accelerometers. These narrow gaps cannot be manufactured using conventional lithographic techniques. FIG. 1e illustrates another stage of the manufacturing process of the MEMS resonator according to one embodiment of the method according to the invention. In this embodiment, the width of the gaps 46,47 in the top layer 40 is reduced by means of a thermal oxidation step. Thermal oxidation is a process well-known to the person skilled in the art. In the case of thermal oxidation of silicon, as is the case in the illustrated example, the oxidation step is generally performed at a temperature around 1000° C. in an environment comprising $O_2$ or $H_2O$. More information on thermal oxidation can be found in S. Wolf, "*Silicon Processing*", Vol. 1, pp. 198-241.

In FIG. 1e, silicon dioxide $SiO_2$ (the dielectric) is grown at all places where silicon is not covered, and particularly on the sidewalls of the gaps 46,47. However, the growth of silicon dioxide can be prevented by providing capping layers locally or in trenches. Alternatively, next to silicon, different materials may be used in the top layer 40, so that only the silicon is oxidized. A well-known isolation technique using this principle is called LOCOS (Local Oxidation Of Silicon). In LOCOS, a silicon nitride ($Si_3N_4$) layer is used to avoid oxidation. Thus, this technique enables the dielectric to be provided on only one sidewall of the gaps 46,47.

Alternatively, instead of oxidation, the dielectric (e.g. silicon oxide, but also silicon nitride) can be deposited on the sidewalls of the gaps 46,47. Several techniques exist for deposition, like atomic layer deposition (ALD) and low-pressure chemical vapor deposition (LPCVD). In order to make sure that the dielectric is deposited on the sidewalls of the gap, tilted/shadow deposition techniques may be used. More information on shadow deposition techniques can be found in S. Wolf, "*Silicon Processing*", Vol. 1, pp. 374.

Before or after the stage illustrated in FIG. 1e, various other steps may be carried out to complete the product, such as:

partial removal of grown/deposited oxides;

formation of electrodes;

formation of bondpads;

formation of additional circuitry;

etc.

The above-mentioned steps are well known to the person skilled in the art.

Figure 2:
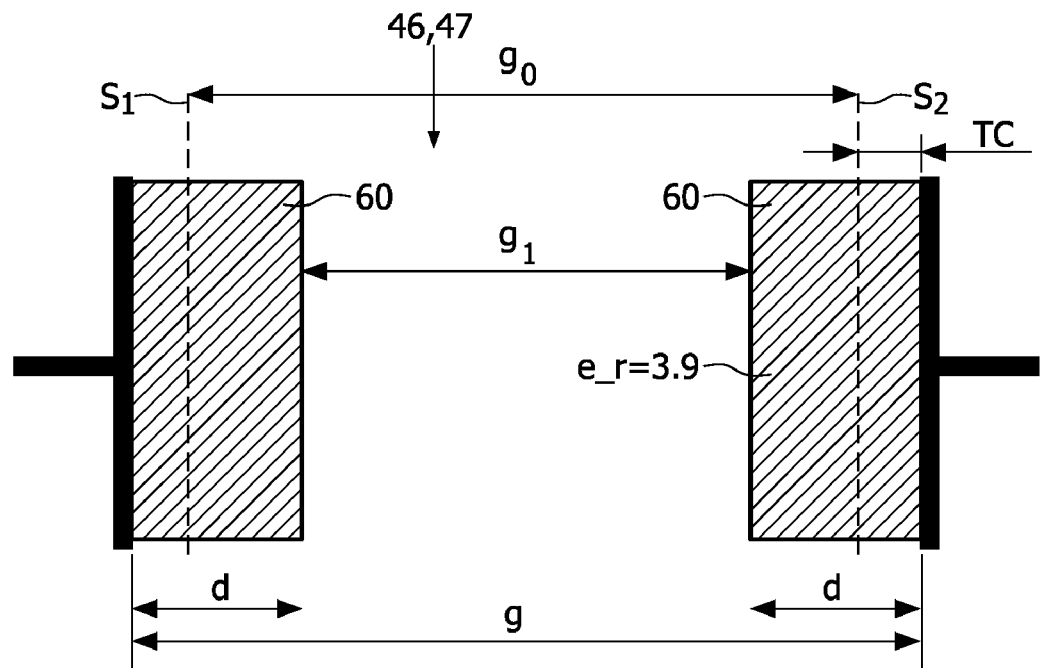
FIG. 2 illustrates the principle of reducing the gap width in the case of forming a dielectric on the sidewalls of the gap by means of oxidation.
Figure 3:
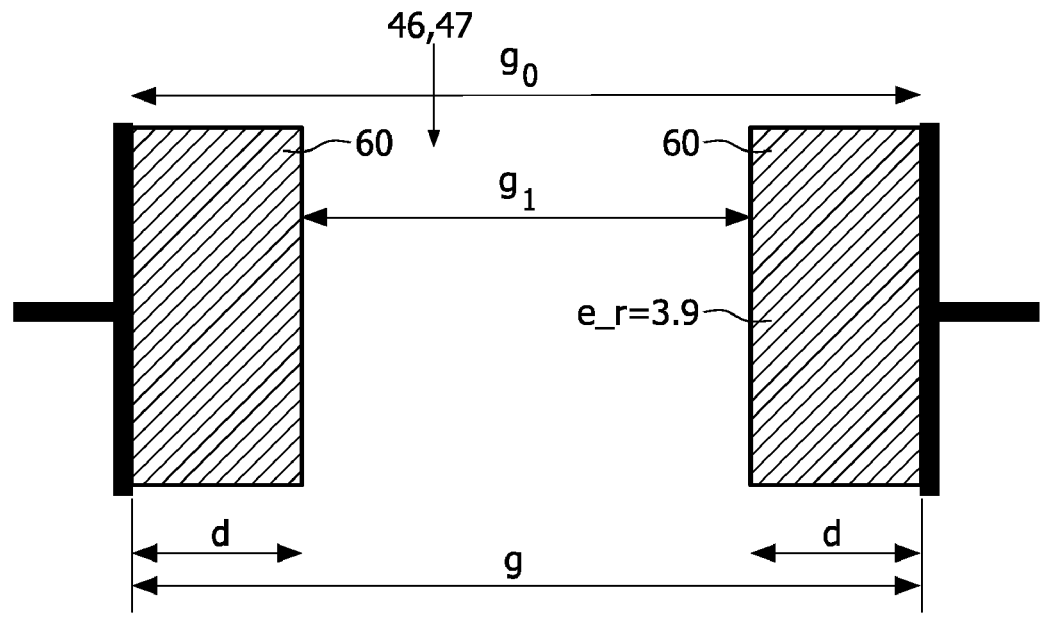
FIG. 3 illustrates the principle of reducing the gap width in the case of forming a dielectric on the sidewalls of the gap by means of deposition.

The effectiveness of the invention can be determined by comparing the effective gap width before and after providing the dielectric, as is depicted in FIG. 2 and FIG. 3. In FIG. 2, the gap width reduction is illustrated for the case that oxidation of silicon is used, and, in FIG. 3, the gap width reduction is illustrated for the case that deposition of silicon oxide is used.

Referring to FIG. 2, the physical gap is reduced from $g_0$ to $g_1$. This is the result of the oxidation of the gap sidewalls, which forms oxide layers 60 having a thickness d. Parameter $g_0$ represents the original gap width, measured from the original sidewalls S1, S2 of the gap 46,47 before oxidation. Parameter g1 represents the physical gap width after oxidation.

The equivalent gap width ($g_{eff}$) of the capacitor that is formed between the two silicon bodies ($\epsilon_r$=3.9) is given by:

$$g_{eff} = g_1 + \frac{2d}{\epsilon_r} = g_1 + \frac{2d}{3.9}$$

Knowing that in the case of grown silicon oxide 44% of the thickness of the oxide is below the original surface, the physical gap width $g_1$ can be expressed in the original gap width $g_0$ as follows:

$$g_0 = g_1 + 2d(1 - 0.44) \Rightarrow g_1 = g_0 - 2d(1 - 0.44)$$

After filling the formula for $g_1$ into the formula for $g_{eff}$, the following relation is obtained:

$$\Rightarrow g_{eff} = g_0 - 2d\left(1 - 0.44 - \frac{1}{3.9}\right) = g_0 - 0.61d \geq 0.46 g_0$$

It can be seen from said formula that the effective gap width $g_{eff}$ is smaller than the original gap width $g_0$. The minimum effective gap width after oxidation is 0.46 $g_0$, which occurs at an oxide thickness of:

$$0.56 d_{max} = 0.5 g_0$$

$$\Rightarrow d_{max} = \frac{0.5}{0.56} g_0 = 0.893 g_0$$

For MEMS resonators using capacitive transduction, this results in a factor of $0.46^{-4}$=22.3 reduction of its impedance at resonance.

Referring to FIG. 3, the situation is slightly different, because in the case of deposition of a dielectric, no silicon (or other material) at the sidewall is consumed. The equivalent gap width ($g_{eff}$) of the capacitor that is formed between the two silicon bodies ($\epsilon_r$=3.9) is given by (similar to FIG. 2):

$$g_{eff} = g_1 + \frac{2d}{\epsilon_r} = g_1 + \frac{2d}{3.9}$$

However, the physical gap width $g_1$ can be expressed in the original gap width $g_0$ as follows:

$$g_0 = g_1 + 2d \Rightarrow g_1 = g_0 - 2d$$

After filling the formula for $g_1$ into the formula for $g_{eff}$, the following relation is obtained:

$$\Rightarrow g_{eff} = g_0 - 2d\left(1 - \frac{1}{3.9}\right) = g_0 - 1.487d \geq 0.256 g_0$$

It can be seen from said formula that the effective gap width $g_{eff}$ is again smaller than the original gap width $g_0$ and even smaller than in the case of oxidation. The minimum effective gap width after oxidation is $0.256 g_0$, which occurs at an oxide thickness d of:

$$d_{max} = 0.5 g_0$$

For MEMS resonators, this results in a factor of $0.256^{-4} = 231.3$ reduction of its impedance at resonance.

The invention thus provides an attractive MEMS resonator, which has a good performance and is a lot easier to manufacture than the MEMS resonators known in the prior art. The invention also provides a method of manufacturing the MEMS resonator, which is much less complex than the methods known in the prior art.

The invention claimed is:

1. A MEMS resonator comprising a substrate having at least one layer, a first electrode, a movable element comprising a second electrode, at least a portion of the second electrode being over the at least one layer, the movable element at least being movable towards the first electrode, the first electrode and the movable element being separated by a gap defined by sidewalls in the substrate, and a dielectric layer on at least one of the sidewalls and being of a material that is different from a material of the substrate.

2. A MEMS resonator as claimed in claim 1, characterized in that the dielectric layer has been provided on at least two of the sidewalls.

3. A MEMS oscillator comprising the MEMS resonator as claimed in claim 1.

4. An integrated circuit comprising the MEMS oscillator as claimed in claim 3.

5. The resonator of claim 1, wherein the sidewalls are silicon sidewalls, and wherein the dielectric layer is a silicon dioxide layer grown on the silicon sidewalls.

6. The resonator of claim 1,
further including a third electrode separated from the second electrode by another gap defined by sidewalls in the substrate and a dielectric layer formed on the sidewalls, the second electrode being disposed between the first and third electrodes and having a portion of the dielectric layer grown from silicon,
the first electrode being configured to apply an electrostatic field that causes the movable element to move, and
the third electrode being configured to sense movement of the movable element caused by application of the applied electrostatic field.

7. A method of manufacturing a MEMS resonator comprising the following steps:
providing a semiconductor body comprising a substrate, a sacrificial layer provided on the substrate layer, and a top layer provided on the sacrificial layer;
patterning the top layer for forming a gap, the gap locally exposing the sacrificial layer, the gap being further arranged for defining a movable element;
selectively removing the sacrificial layer for partially releasing the movable element from the substrate layer; and
after selectively removing the sacrificial layer, providing a dielectric layer on at least one sidewall of the gap associated with the top layer around the movable element.

8. A method as claimed in claim 7, characterized in that in the step of providing a semiconductor body, the top layer comprises silicon.

9. A method as claimed in claim 8, characterized in that the step of providing a dielectric layer comprises an oxidation step, whereby at least the silicon of at least one sidewall of the gap associated with the top layer is converted into silicon oxide.

10. A method as claimed in claim 7 characterized in that the step of providing a dielectric layer comprises deposition of the dielectric layer, the dielectric layer being provided on at least one sidewall of the gap associated with the top layer.

11. The method of claim 7, wherein providing a dielectric layer on at least one sidewall of the gap associated with the top layer around the movable element includes growing the dielectric layer after the sacrificial layer has been removed for partially releasing the movable element.

12. The method of claim 7, wherein providing a dielectric layer on at least one sidewall of the gap includes oxidizing at least one of the movable element and an electrode defined by a portion of the substrate layer separated from the movable element by the gap.

13. The method of claim 7, wherein providing a dielectric layer on at least one sidewall of the gap associated with the top layer around the movable element includes growing the dielectric layer to a thickness to narrow the gap.

14. The method of claim 7, wherein providing a dielectric layer on at least one sidewall of the gap includes growing the dielectric layer to a thickness to narrow the gap and to reduce the motional impedance of the resonator.

15. The method of claim 7, further including using the provided dielectric layer to set the motional impedance of the resonator for an implementation in which the resonator is to be used.

16. A MEMS resonator comprising:
a substrate;
a first electrode formed on the substrate;
a movable element formed on the substrate and including a second electrode, the movable element having an underside that is at least partially released from the substrate and is configured to move relative to the first electrode;
a gap in the substrate that separates the first electrode and the movable element, the gap being defined by sidewalls; and
a dielectric layer grown on at least one of the sidewalls, the dielectric layer including an oxidized portion.

17. The MEMS resonator of claim 16, wherein the dielectric layer is on at least two of the sidewalls.

18. The MEMS resonator of claim 16, further including an oscillator that comprises the MEMS resonator.

19. The MEMS resonator of claim 16, wherein the substrate includes silicon, and the dielectric layer includes a silicon dioxide oxidized portion of the silicon substrate.

20. The MEMS resonator of claim 16, further including a third electrode separated from the second electrode by another gap defined by sidewalls in the substrate and a dielectric layer formed on the sidewalls, the second electrode being disposed between the first and third electrodes and having a portion of the dielectric layer formed from oxidized silicon in the substrate, the first electrode being configured to apply an electrostatic field that causes the movable element to move, and the third electrode being configured to sense movement of the movable element caused by application of the applied electrostatic field.

* * * * *